United States Patent
Hsin et al.

(10) Patent No.: US 7,598,580 B1
(45) Date of Patent: Oct. 6, 2009

(54) IMAGE SENSOR MODULE PACKAGE STRUCTURE WITH SUPPORTING ELEMENT

(75) Inventors: Chung-Hsien Hsin, Hsinchu (TW); Chun-Hua Chuang, Hukou Township, Hsinchu County (TW); Chen-pin Peng, Beipu Township, Hsinchu County (TW); Chien-Wei Chang, Sinpu Township, Hsinchu County (TW); Chien-Hen Lin, Yangmei Township, Taoyuan County (TW)

(73) Assignee: Kingpak Technology Inc., Hsin Chu Hsien (TW)

( * ) Notice: Subject to any disclaimer, the term of this patent is extended or adjusted under 35 U.S.C. 154(b) by 0 days.

(21) Appl. No.: 12/153,237

(22) Filed: May 15, 2008

(51) Int. Cl.
*H01L 31/0232* (2006.01)

(52) U.S. Cl. .......... 257/432; 257/433; 257/704

(58) Field of Classification Search ........... 257/432, 257/433, 693, 704, 778
See application file for complete search history.

(56) References Cited

U.S. PATENT DOCUMENTS 7,221,051 B2 * 5/2007 Ono et al. ........... 257/704

7,297,918 B1  11/2007 Chen et al.

FOREIGN PATENT DOCUMENTS

TW         200709444     8/1994

* cited by examiner

*Primary Examiner*—Thien F Tran
(74) *Attorney, Agent, or Firm*—Stites & Harbison PLLC; Juan Carlos A. Marquez, Esq.

(57) ABSTRACT

An image sensor module package structure with a supporting element comprises a chip, the supporting element and a light-transmitting element. The chip has light-sensing elements arranged on a light-sensing area of a first surface thereof, first conducting pads electrically connected to the light-sensing elements, and a conducting channel passing through the chip and electrically connected to the first conducting pads at one end. The supporting element has an opening, a first coupling surface, and a second coupling surface. The opening corresponds to the light-sensing area and the first coupling surface is combined with the first surface of the chip while the light-transmitting element is combined with the second coupling surface. The supporting element separates the light-transmitting element from the chip by a proper distance, so as to enhance an image sensing accuracy of an image sensor module. The chip having the conducting channel effectively facilitates reducing an overall volume of the image sensor module package structure.

15 Claims, 5 Drawing Sheets

IMAGE SENSOR MODULE PACKAGE STRUCTURE WITH SUPPORTING ELEMENT

BACKGROUND OF THE INVENTION

1. Technical Field

The present invention relates to an image sensor module package structure with a supporting element, and more particularly to an image sensor module package structure whose production yield is improved.

2. Description of Related Art

With the invention and popularization of various digital image products, a market demand for image sensor modules for being applied to these digital image products, such as digital cameras, camera phones, video phones, fingerprint readers, and so on, have been gradually increased. Generally speaking, image sensor modules, while using different light-sensing elements, can be classified into complementary metal oxide semiconductor (CMOS) image sensor modules and charge couple image sensor modules.

Since the CMOS image sensor modules and the charge couple image sensor modules possess both advantages and disadvantages, respectively, they may be adopted in diverse applications according to the manufacturers' needs. However, in view of the trend of burgeoning and miniaturized digital image products, it is necessary to reduce the volumes and improve the production yield of the image sensor modules so as to meet the practical needs of modern applications.

For example, Taiwan Patent Application No. 200709444 provides a package structure for a light-sensing element. The package structure includes the light-sensing element, a base and a transparent layer. The light-sensing element is electrically connected to metallization traces on the base by a wiring means. Furthermore, by changing positions of the metallization traces, joints between metal wires and the metallization traces can be positioned at a position slight higher than a top of the light-sensing element so as to shorten a wiring distance of the metal wires and in turn reduce a package area.

In the process of manufacturing the conventional light-sensing elements, the entire transparent layer is covered on a top surface of a base of a wafer and then the light-sensing elements are cut off the wafer. Since it is difficult to ensure the absolute clearness of the transparent layer before it is put on the top surface of the base, any defect or stain on the transparent layer can jeopardize the image-sensing sensitivity and the production yield of the resultant light-sensing elements. On the other hand, in an alternative case, when a light-pervious glass is implemented as the transparent layer, edges thereof tend to be cracked or jagged in a cutting process and thus the production yield of the resultant light-sensing elements is suffered.

In U.S. Pat. No. 7,297,918, where an image sensor package structure and an image sensing module are disclosed, the image sensor package structure comprises a substrate, an image sensing chip, a light transparent layer, and a frame. The substrate has a plurality of metallization traces on a surface thereof. The image sensing chip is mounted on said substrate and electrically connected to said metallization traces on said substrate. The light transparent layer is located above said image sensing chip. The frame is mounted on said substrate and around said image sensing chip. A top of said frame extends toward said image sensing chip and upwards to form a locking and placing portion with an L-shaped cross section so that bend positions of said locking and placing portion form a placement space to accommodate and position said light transparent layer.

Though U.S. Pat. No. 7,297,918 is advantageous for having a simple structure, facilitating adhering as well as packaging, and ensuring the production yield of the image sensor module package structure by providing the locking and placing portion to prevent the light transparent layer to be cut directly, the substrate is still necessary for carrying the chip and a wiring procedure is still necessary for electrically connecting the image sensing chip and the metallization traces on the substrate. Consequently, a wiring space cannot be saved on the conventional image sensor module package structure and thus the image sensor module package structure cannot be further downsized.

FIG. 1 is a sectional view of a conventional image sensor module package structure 10. Therein, a light transparent layer 11 is combined with a chip 13 by an adhesive layer 12. The chip 13 has a plurality of light-sensing elements 14, a plurality of conducting pads 15 and at least one conducting channel 16. The light-sensing elements 14 are arranged on a light-sensing area of a top surface of the chip 13. The conducting pads 15 are electrically connected to the light-sensing elements 14 and electrically connected to one end of the conducting channel 16 passing through the chip 13. By using the chip 13 having the conducting channel 16, the image sensing chip 13 can be electrically connected to metallization traces on a substrate without a wiring procedure. As a result, the wire space can be spared in the image sensor module package structure 10 and thereby an overall volume of the image sensor module package structure 10 can be reduced.

However, because the light transparent layer 11 and the chip 13 are combined simply by the adhesive layer 12 sandwiched therebeteween, the light transparent layer 11 and the light-sensing elements 14 are distant from each other for merely a minute distance that tends to incur aberration of images, and the light-sensing elements 14 may fail to accurately sense images. Besides, if defects or stains exist on the light transparent layer 11, such defects or stains will be magnified directly and make the image sensor module package structure 10 handicapped in accurately and sensitively sensing images.

SUMMARY OF THE INVENTION

The present invention discloses an image sensor module package structure with a supporting element, wherein the supporting element separates a light-transmitting element from light-sensing elements by a proper distance so as to enhance an image-sensing accuracy and an image-sensing sensitivity of the image sensor module package structure. Furthermore, the image sensor module package structure has a chip including a conducting channel that allows the chip to be electrically connected to an external circuit therethrough without a need of electrically connecting the chip with metallization traces on a substrate or a base by means of wiring, so as to save wiring space and in turn reduce a volume of the image sensor module package structure.

To achieve the above end, the image sensor module package structure with the supporting element comprises a chip having a plurality of light-sensing elements arranged on a light-sensing area of a first surface of the chip, a plurality of first conducting pads electrically connected to the light-sensing elements, and at least one conducting channel passing through the chip and electrically connected to the first conducting pads at one end; the supporting element which is a flat plate having an opening, a first coupling surface, and a second coupling surface, wherein the opening corresponds to the light-sensing area and the first coupling surface is combined with the first surface; and a light-transmitting element combined with the second coupling surface.

In the aforementioned image sensor module package structure, the chip may be a complementary metal oxide semiconductor (CMOS) image sensor chip. The chip may further comprise a plurality of second conducting pads or conducting balls or a ball grid array while being arranged on a second surface of the chip and electrically connected to the conducting channel.

In the aforementioned image sensor module package structure, the first conducting pads may be arranged around the light-sensing area.

In the image sensor module package structure, the supporting element may further comprise a protruding portion that is arranged on one side of the light-transmitting element and the supporting element may be made of a plastic material or a metal material.

In the image sensor module package structure, the first coupling surface may be combined with the first surface by an adhesive, a thermosetting adhesive or an UV curable adhesive.

In the image sensor module package structure, the light-transmitting element may be combined with the second coupling surface by an adhesive, a thermosetting adhesive or an UV curable adhesive. The light-transmitting element may be an optical glass or the light-transmitting element may be made of a resin material or a plastic material. Besides, one surface or both surfaces of the light-transmitting element may be coated with an IR cut filtering layer.

By implementing the present invention, at least the following progressive effects can be achieved:

1. A volume of the image sensor module package structure can be reduced;
2. An image-sensing accuracy and an image-sensing sensitivity of the image sensor module package structure can be enhanced; and
3. A production yield of the image sensor module package structure can be improved.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

Figure 1:
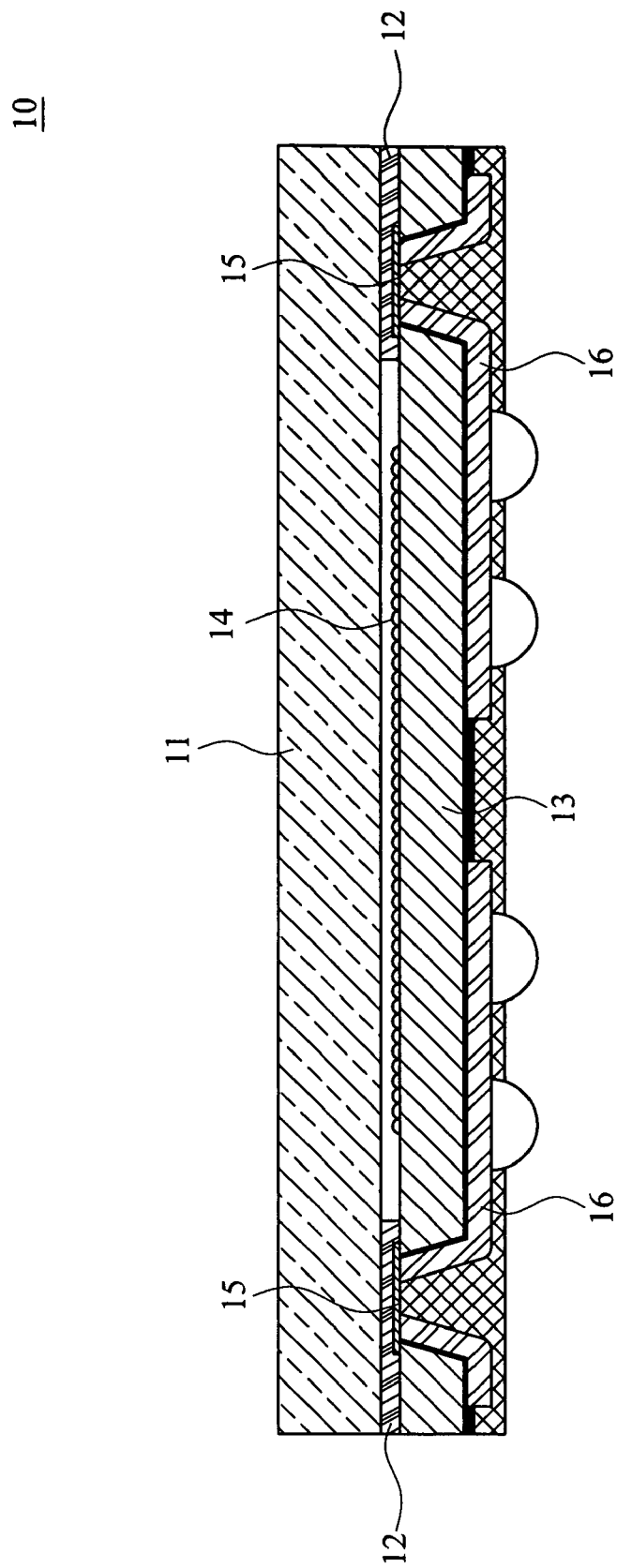
FIG. 1 is a sectional view of a conventional image sensor module package structure.
Figure 2:
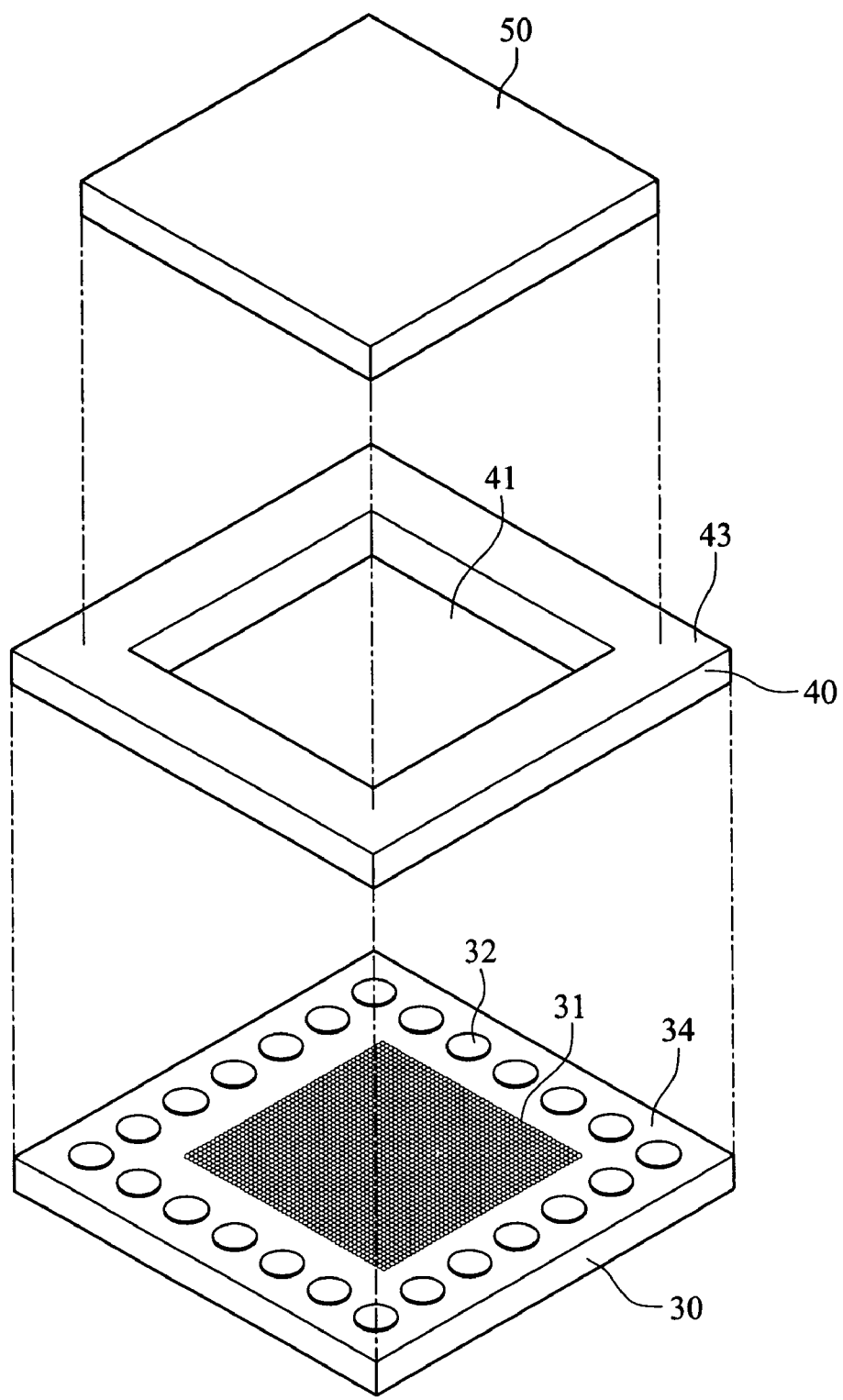
FIG. 2 is an exploded view of an image sensor module package structure according to a first embodiment of the present invention.

As can be seen in FIG. 2, the image sensor module package structure 20 with a supporting element of the first embodiment comprises a chip 30, the supporting element 40 and a light-transmitting element 50.

Figure 3:
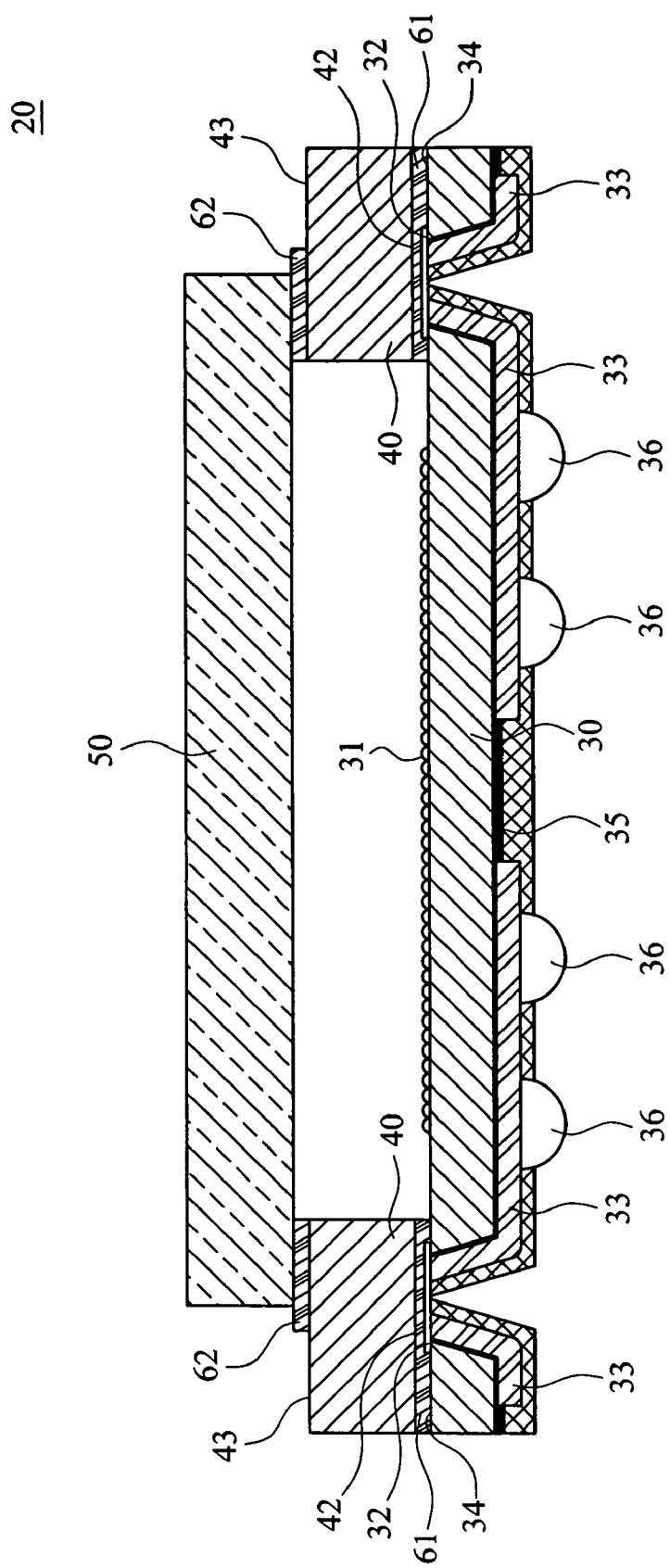
FIG. 3 is a sectional view of the image sensor module package structure according to the first embodiment of the present invention.

The chip 30 may be a complementary metal oxide semiconductor (CMOS) image sensor chip. As shown in FIG. 3, the chip 30 has a plurality of light-sensing elements 31, a plurality of first conducting pads 32, and at least one conducting channel 33.

The light-sensing elements 31 are arranged on a light-sensing area of a first surface 34, namely a top surface, of the chip 30 and serve to sense lights entering the image sensor module package structure 20. The first conducting pads 32 are arranged around the light-sensing area of the chip 30 and electrically connected to the light-sensing elements 31. The conducting channel 33 passes through the chip 30 so that one end thereof reveals at a second surface 35 of the chip 30, namely a bottom surface of the chip 30, while an opposite end thereof is electrically connected to the first conducting pad 32.

Sine one said end of the conducting channel 33 reveals at the second surface 35 of the chip 30 and the other said end is electrically connected to the first conducting pad 32 that is electrically connected to the light-sensing elements 31, the light-sensing elements 31 is allowed to be electrically connected to an external circuit (not shown) at the second surface 35 simply through the conducting channel 33 so as to save a procedure of electrically connecting the chip 30 to a substrate or a base by a wiring means and in turn simplify a manufacturing process of the image sensor module package structure 20. On the other hand, since the need of electrically connecting the chip 30 to a substrate or a base by the wiring means is eliminated, an overall volume of the image sensor module package structure 20 can be reduced.

To achieve an electrical connection between the chip 30 and the external circuit, the chip 30 may further comprise a plurality of second conducting pads (not shown). The second conducting pads may be known metal conducting pins. Alternatively, as shown in FIG. 3, the chip 30 may further comprise a plurality of conducting balls 36 which are arranged into a ball grid array (BGA) and settled on the second surface 35 of the chip 30 while being electrically connected to the conducting channel 33 at one end. The conducting balls 36 may be settled on the second surface 35 of the chip 30 though a conventional ball-mounting process so as to enhance a heat dissipating effect of the image sensor module package structure 20.

According to FIG. 2, the supporting element 40 is a flat plate that has an opening 41, a first coupling surface 42, and a second coupling surface 43. The supporting element 40 may be made of a plastic material or a metal material. The opening 41 is provided at a center of the supporting element 40 and corresponds to the light-sensing area of the chip 30 so that the light-sensing area is exposed from the supporting element 40 and thereby the light-sensing area can fully receive lights entering the image sensor module package structure 20.

Referring to FIG. 3, the first coupling surface 42 is a bottom surface of the supporting element 40 and the second coupling surface 43 is a top surface of the supporting element 40. The first coupling surface 42 may be combined with the first surface 34 of the chip 30 by an adhesive 61, such as a thermosetting adhesive or an UV curable adhesive, so that the supporting element 40 can be positioned on the chip 30.

The light-transmitting element 50 may be made of a resin material or a plastic material. Alternatively, the light-transmitting element 50 may be an optical glass. The light-transmitting element 50 may be combined with the second surface 43 of the supporting element 40 by an adhesive 62, such as a thermosetting adhesive or an UV curable adhesive, so that the light-transmitting element 50 can be positioned on the supporting element 40.

For enhancing an image sensing effect of the image sensor module package structure 20, when the light-transmitting element 50 is the optical glass, one surface of the light-transmitting element 50 may be coated with an IR cut filtering layer. More preferably, for enhancing the image sensing effect of the image sensor module package structure 20, both surfaces of the light-transmitting element 50 may be coated with an IR cut filtering layer.

Figure 4:
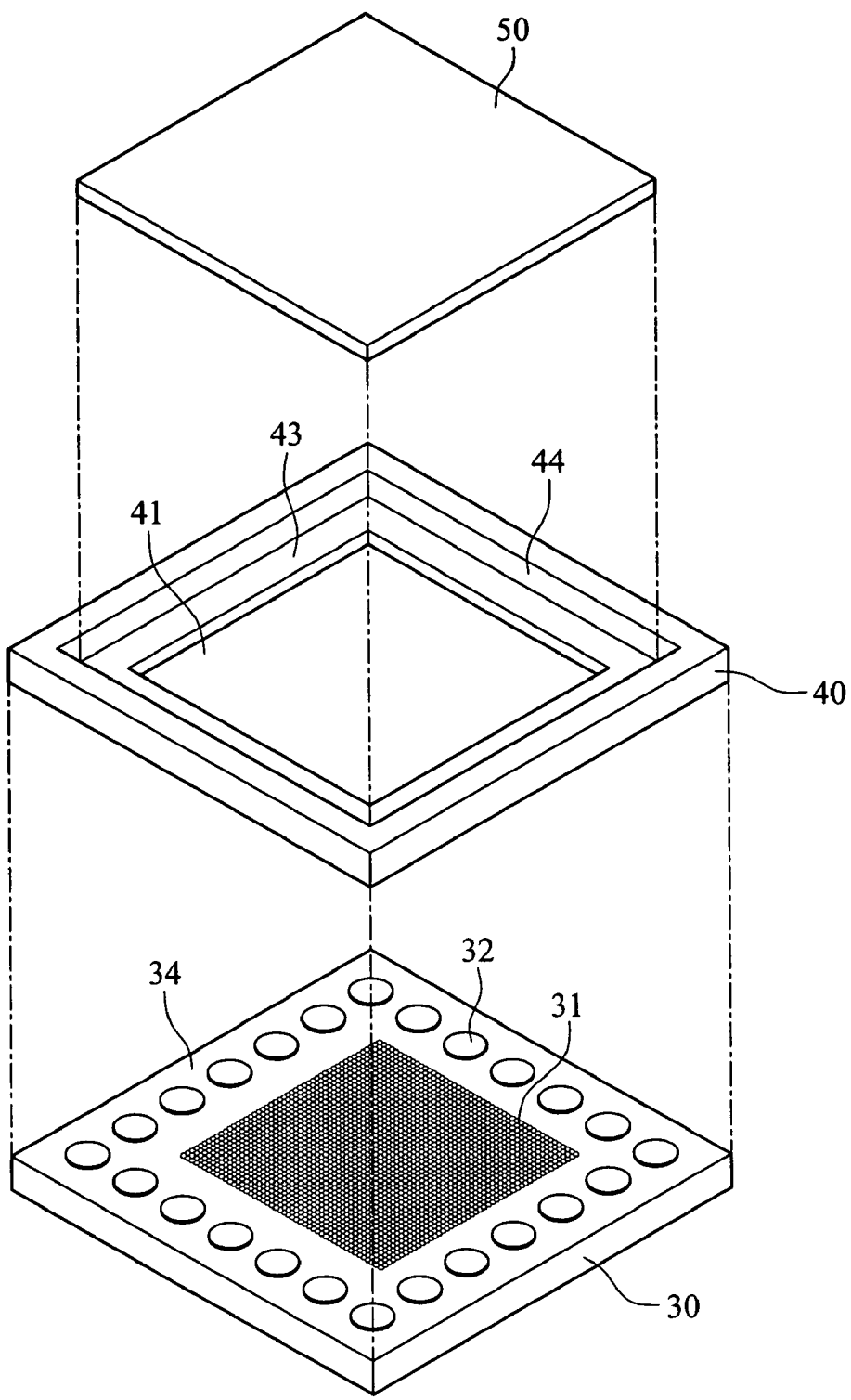
FIG. 4 is an exploded view of an image sensor module package structure according to a second embodiment of the present invention.
Figure 5:
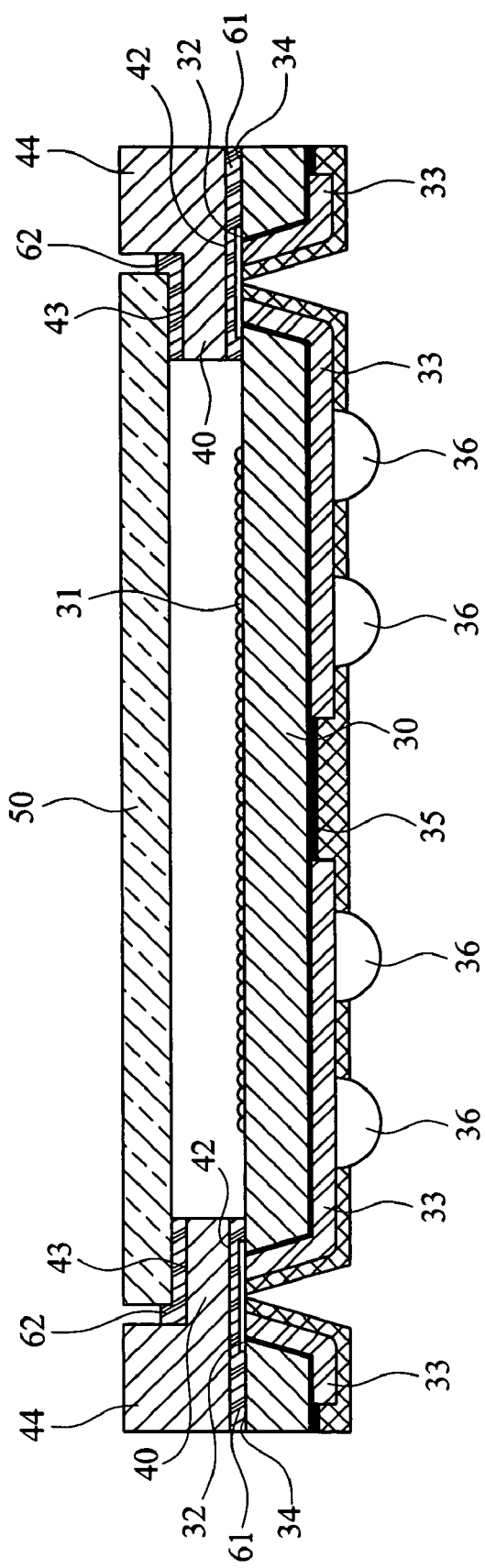
FIG. 5 is a sectional view of the image sensor module package structure according to the second embodiment of the present invention.

Reference is now made to FIG. 4, for combining the light-transmitting element 50 with the supporting element 40 more accurately, the supporting element 40 may further comprise a protruding portion 44 which is formed by extending an outer edge of the supporting element 40 upward. As shown in FIG. 5, the protruding portion 44 of the supporting element 40 may be arranged on one side of the light-transmitting element 50 for positioning the light-transmitting element 50.

By implementing the present embodiment, since the light-transmitting element 50 is positioned on the supporting element 40, the light-transmitting element 50 and the light-sensing elements 31 of the chip 30 can be properly separated so that an image sensing accuracy and an image sensing sensitivity of the image sensor module package structure 20 can be improved. In addition, the chip 30 having the conducting channel 33 contributes to save wiring space and effectively reduce a volume of the image sensor module package structure 20.

Moreover, since the light-transmitting element 50 can receive a thoroughgoing check before being combined with the second coupling surface 43 of the supporting element 40, a defective or stained light-transmitting element 50 can be sieved out from being combined with the second coupling surface 43 of the supporting element 40, so that a production yield of the image sensor module package structure 20 can be enhanced.

Although the particular embodiments of the invention have been described in detail for purposes of illustration, it will be understood by one of ordinary skill in the art that numerous variations will be possible to the disclosed embodiments without going outside the scope of the invention as disclosed in the claims.

What is claimed is:

1. An image sensor module package structure with a supporting element, comprising:
a chip having a plurality of light-sensing elements arranged on a light-sensing area of a first surface of the chip, a plurality of first conducting pads electrically connected to the light-sensing elements, and at least one conducting channel passing through the chip and electrically connected to the first conducting pads at one end;
the supporting element, which is a flat plate having an opening, a first coupling surface, and a second coupling surface, wherein the opening corresponds to the light-sensing area and the first coupling surface is combined with the first surface; and
a light-transmitting element combined with the second coupling surface.

2. The image sensor module package structure as claimed in claim 1, wherein the chip is a complementary metal oxide semiconductor (CMOS) image sensor chip.

3. The image sensor module package structure as claimed in claim 1, wherein the chip further comprises a plurality of second conducting pads or conducting balls which are arranged on a second surface of the chip and electrically connected to the conducting channel.

4. The image sensor module package structure as claimed in claim 1, wherein the chip further comprises a ball grid array, which is arranged on a second surface of the chip and electrically connected to the conducting channel.

5. The image sensor module package structure as claimed in claim 1, wherein the first conducting pads are arranged around the light-sensing area.

6. The image sensor module package structure as claimed in claim 1, wherein the supporting element further comprises a protruding portion arranged on one side of the light-transmitting element.

7. The image sensor module package structure as claimed in claim 1, wherein the supporting element is made of a plastic material or a metal material.

8. The image sensor module package structure as claimed in claim 1, wherein the first coupling surface is combined with the first surface by an adhesive.

9. The image sensor module package structure as claimed in claim 1, wherein the first coupling surface is combined with the first surface by a thermosetting adhesive or an UV curable adhesive.

10. The image sensor module package structure as claimed in claim 1, wherein the light-transmitting element is combined with the second coupling surface by an adhesive.

11. The image sensor module package structure as claimed in claim 1, wherein the light-transmitting element is combined with the second coupling surface by a thermosetting adhesive or an UV curable adhesive.

12. The image sensor module package structure as claimed in claim 1, wherein the light-transmitting element is an optical glass.

13. The image sensor module package structure as claimed in claim 1, wherein the light-transmitting element is an optical glass and one surface of the light-transmitting element is coated with an IR cut filtering layer.

14. The image sensor module package structure as claimed in claim 1, wherein the light-transmitting element is an optical glass and both surfaces of the light-transmitting element are coated with an IR cut filtering layer.

15. The image sensor module package structure as claimed in claim 1, wherein the light-transmitting element is made of a resin material or a plastic material.

* * * * *